United States Patent [19]
Van Beers

[11] Patent Number: 5,739,500
[45] Date of Patent: Apr. 14, 1998

[54] IC CARD CLOSURE AND WELDING APPARATUS

[75] Inventor: Franciscus Cornelis Van Beers, Rancho Santa Margarita, Calif.

[73] Assignee: ITT Cannon, Inc., Santa Ana, Calif.

[21] Appl. No.: 575,459

[22] Filed: Dec. 20, 1995

[51] Int. Cl.$^6$ .............................. B23K 11/00; H05K 1/14
[52] U.S. Cl. ............................... 219/117.1; 361/737
[58] Field of Search .................. 219/117.1, 119; 361/737, 752, 796, 800, 802; 29/463, 509, 521

[56] References Cited

U.S. PATENT DOCUMENTS

| | | | |
|---|---|---|---|
| 5,386,340 | 1/1995 | Kurz | 361/737 |
| 5,493,477 | 2/1996 | Hirai | 361/737 |
| 5,495,664 | 3/1996 | Semple et al. | 29/823 |
| 5,502,620 | 3/1996 | Funck et al. | 363/753 |
| 5,515,595 | 5/1996 | Kurz | 29/509 |
| 5,546,278 | 8/1996 | Bethurum | 361/737 |
| 5,548,485 | 8/1996 | Bethutum | 361/737 |

OTHER PUBLICATIONS

ITT Cannon Catalog; StarCard Classic–PCMCIA I/O Card Kit; SCC–2/1094; Copyright 1994 ITT Corporation.

*Primary Examiner*—Matthew V. Nguyen
*Attorney, Agent, or Firm*—Frelich Hornbaker Rosen

[57] ABSTRACT

A system is described for completing the construction of an IC (integrated circuit) card, of the type that includes an inner unit (18) formed by a pair of connectors (14, 16) at opposite ends of a circuit board (12), and a sheet metal cover (20) with upper and lower halves (22, 24) that must be fixed together around the inner unit. The system includes front, left, and right weld units (50, 52, 54) arranged about an imaginary rectangular weld region (60), a guide rail (72) extending rearwardly from below the weld region, and a slide assembly (70) with a card-holding fixture, that can slide forwardly into the weld region and rearwardly out of the weld region. A pair of rollers (82, 84) is separately movable forwardly so flanges (86, 88) on the rollers progressively close the upper cover half on the lower one, and then movable rearwardly out of the way, so the slide assembly with a closed card can be moved into the weld region where welds are formed to fix the cover halves together. The system includes a frame (42) with a plate-like platform (44), with the weld units, guide track and slider assembly, and rollers all lying above the platform. A pair of actuators that move the slide assembly and rollers lie below the platform.

14 Claims, 6 Drawing Sheets

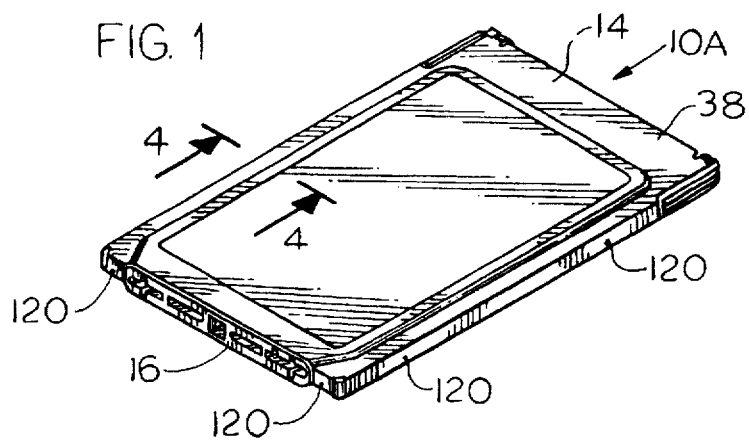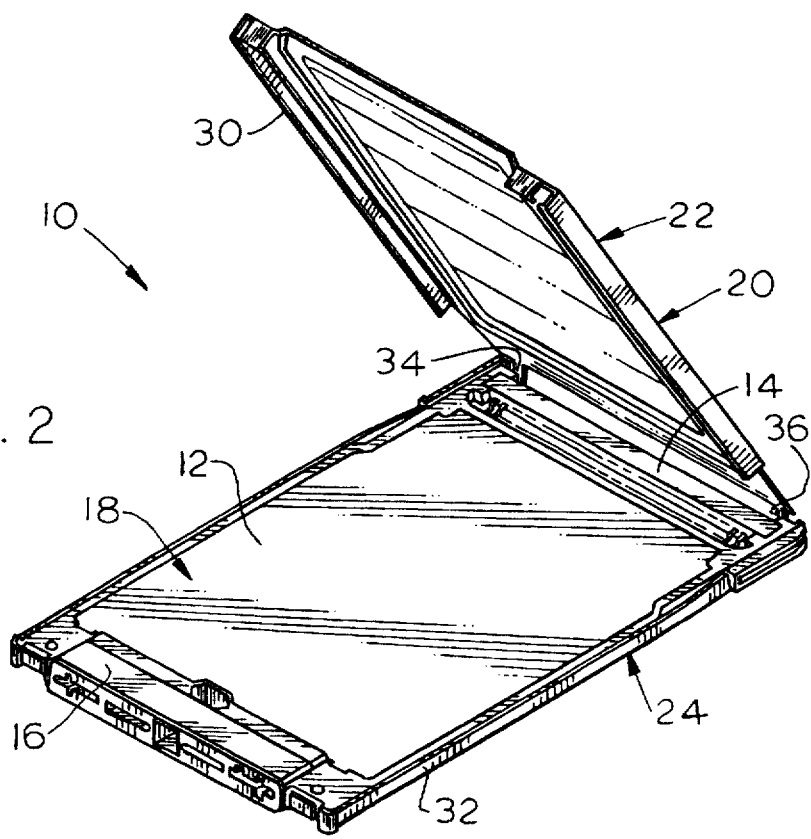

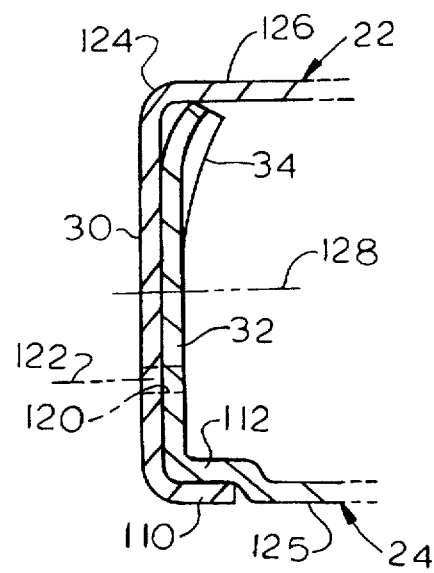
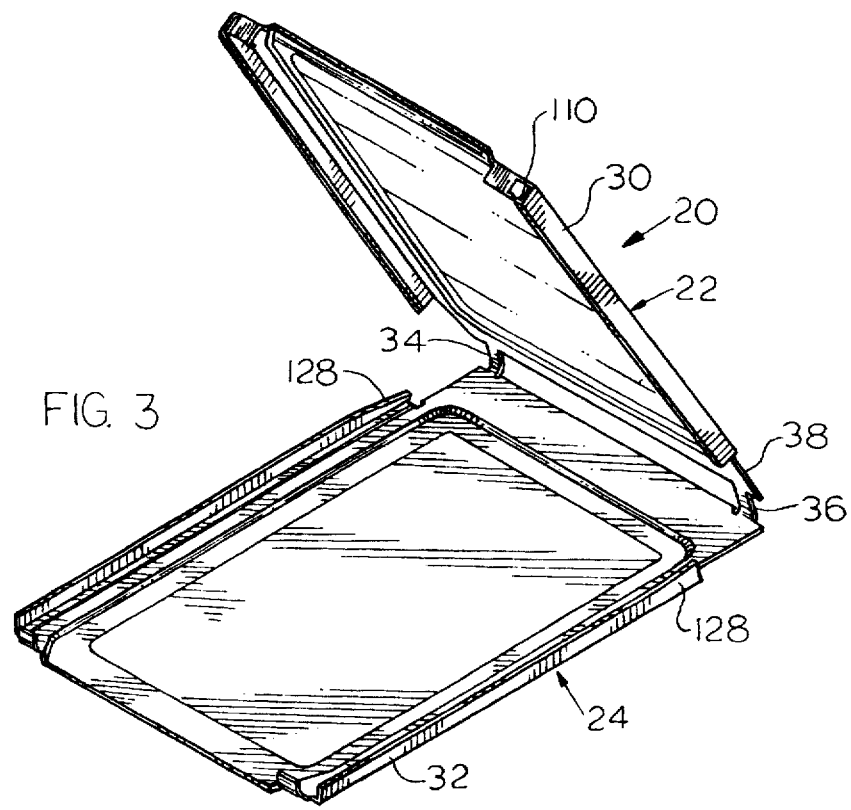

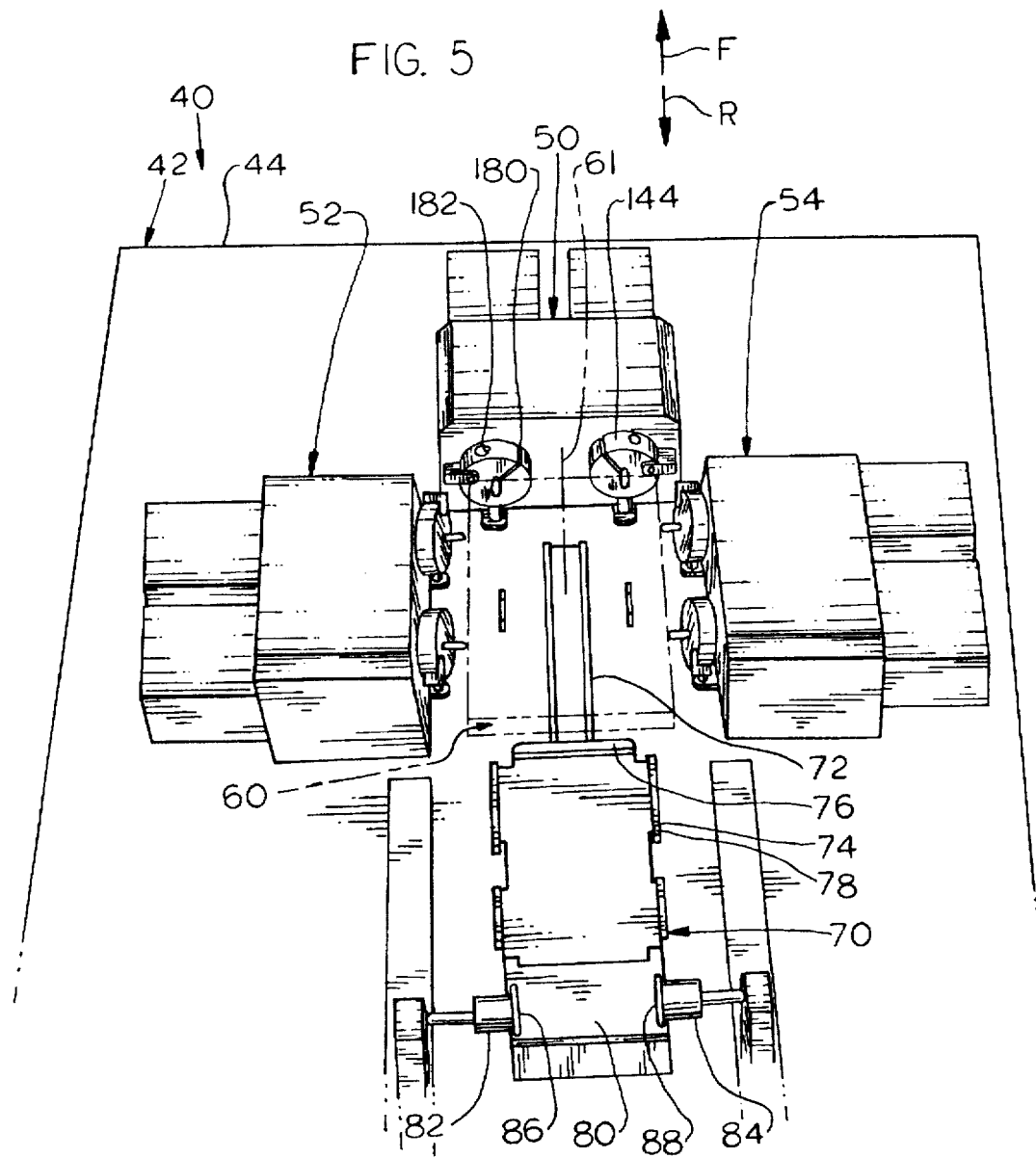

5,739,500

1

IC CARD CLOSURE AND WELDING APPARATUS

BACKGROUND OF THE INVENTION

IC (integrated circuit) cards are usually constructed in accordance with JEIDA and PCMCIA standards, wherein one type of card has a length of 3.370 inch, a card width of 2.126 inch, and a card thickness of 0.190 inch. Each card includes a circuit board with electronic components thereon, a front connector and usually also a rear connector mounted at opposite ends of the card, and a sheet metal cover that encloses the circuit board and much of the connectors. A molded plastic body, or frame, is sometimes used to hold the circuit board, connectors, and cover together. A manufacturer of parts for an IC card supplies the connectors and sheet metal cover, and any body. The customer manufacturers the circuit board to his specifications, and must assemble the card components, including fastening upper and lower cover halves together.

A variety of approaches can be used to fasten the cover halves together. Apparatus that can rapidly and securely join the cover halves is provided by resistance weld equipment. For a relatively small customer, it is important that the weld equipment be of relatively small size while providing multiple spot welds. It is also highly desirable if the equipment can perform and assure full closure of the cover halves prior to welding, all in an automated apparatus.

SUMMARY OF THE INVENTION

In accordance with one embodiment of the present invention, a method and apparatus are provided for completing the assembly of an IC card by closing and welding together a pair of sheet metal halves around an inner unit formed by a circuit board and a pair of connectors. The apparatus includes a frame with a platform having an upper surface and three weld units arranged respectively at the front and opposite sides of an imaginary rectangular, or parallelepiped, weld region. A guide rail extends rearwardly from below the weld region, and supports a slide assembly that carries a card having a pair of sheet metal cover halves that are to be welded together. A pair of rollers are mounted on holders that move forwardly to progressively roll down the upper cover half onto the lower cover half, prior to moving the slide assembly with the closed covers thereon, into the weld region, where the front and opposite sides of the card are welded together.

A pair of actuators for moving the slide assembly and roller holders considerable distances, are located at the underside of the plate-like platform. An actuator for moving a pair of ground electrodes up against the weld fixture during welding, also lies below the platform. The arrangement provides all of the necessary functions in a very compact and relatively uncluttered apparatus.

The novel features of the invention are set forth with particularity in the appended claims. The invention will be best understood from the following description when read in conjunction with the accompanying drawings.

BRIEF DESCRIPTION OF THE DRAWINGS

FIG. 1 is an isometric view of a fully assembled and welded IC card.

FIG. 2 is an isometric view of the card of FIG. 1, with all components put together, but with the upper cover half not yet closed or welded to the lower cover half.

FIG. 3 is an isometric view of only the cover of the IC card of FIG. 2.

2

FIG. 4 is a view taken on line 4—4 of FIG. 1.

FIG. 5 is a perspective view of apparatus for completing the assembly of the IC card of FIG. 2.

Figure 6:
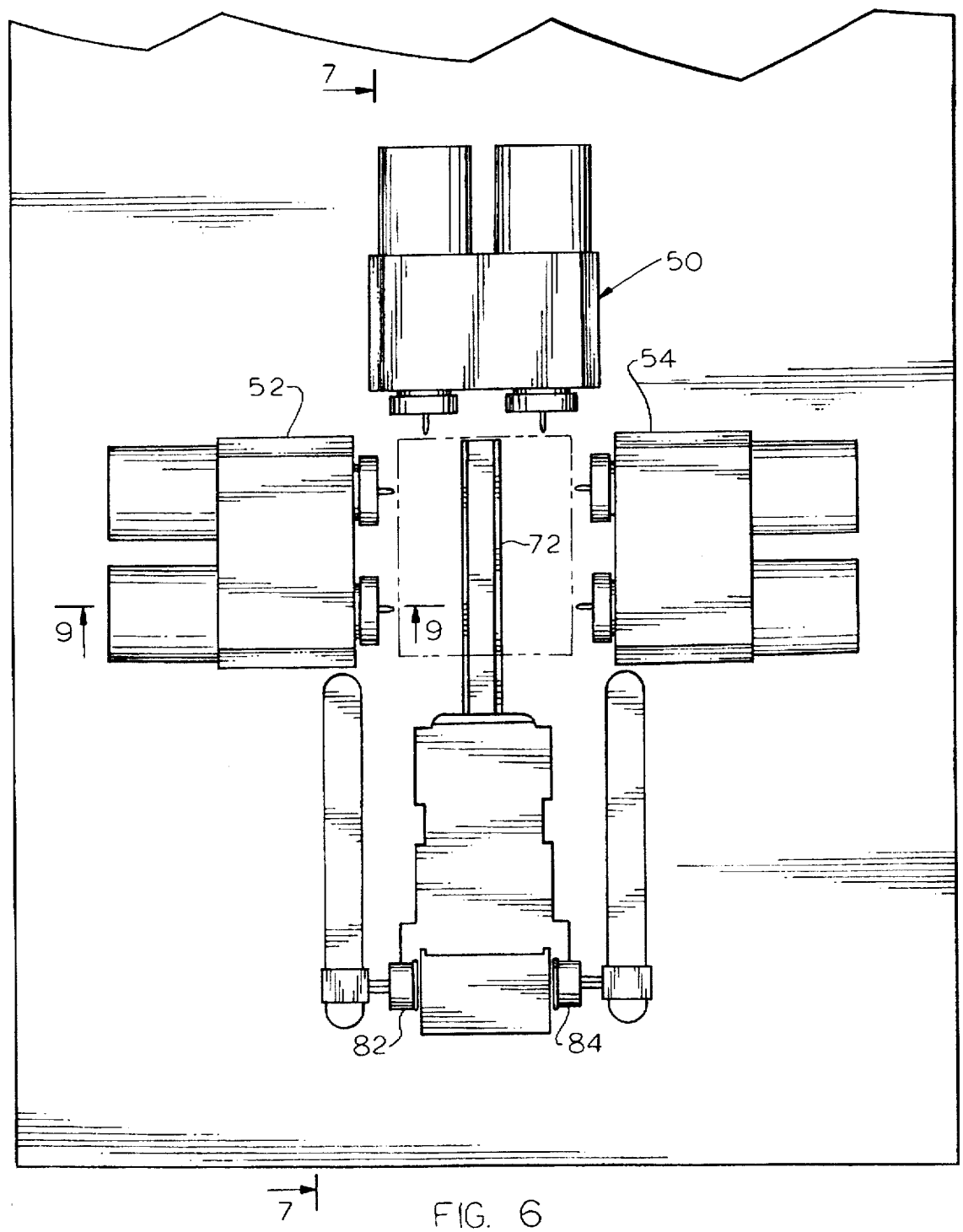

FIG. 6 is a plan view of the apparatus of FIG. 4.

Figure 7:
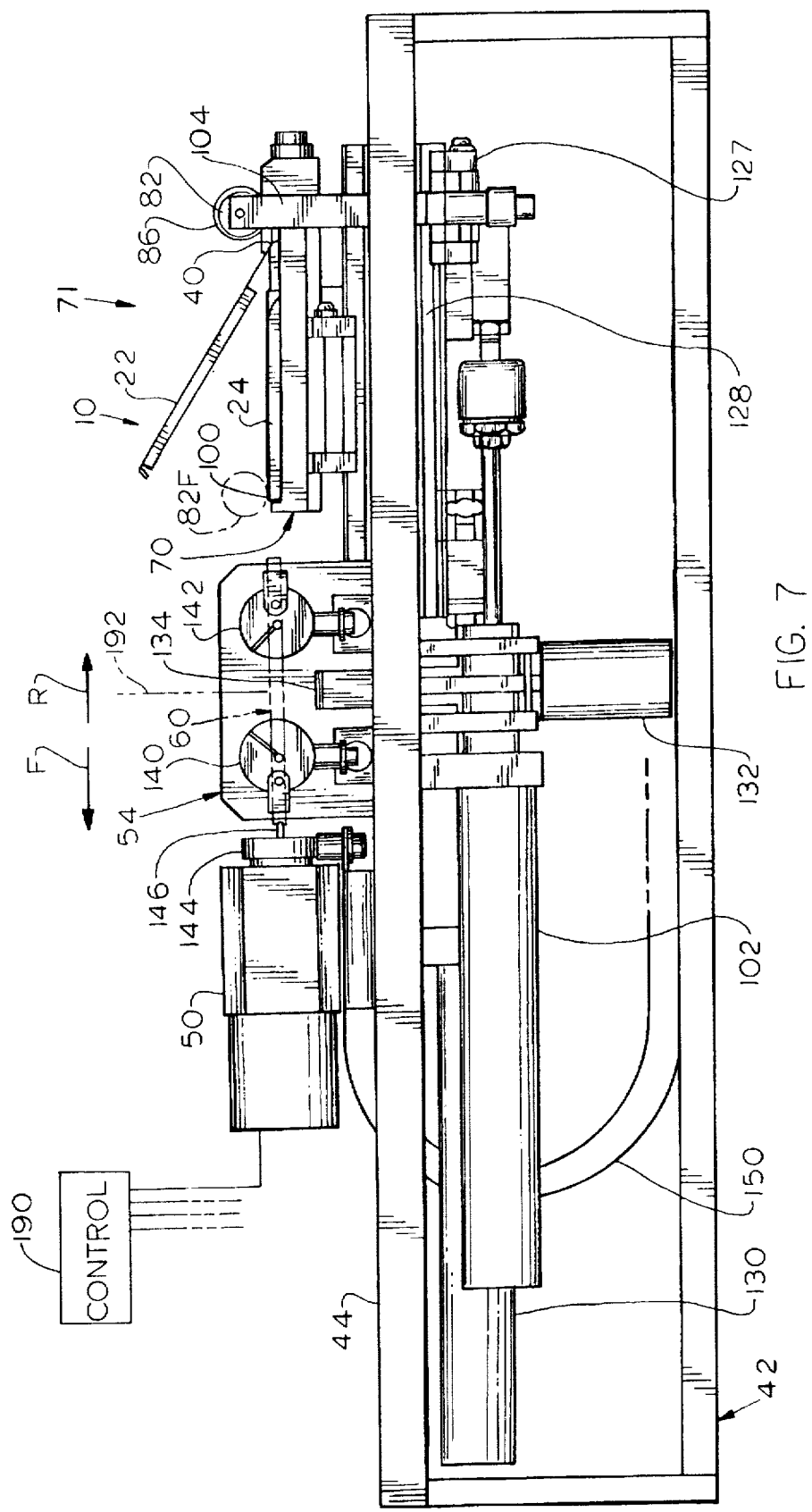

FIG. 7 is a view taken on line 7—7 of FIG. 6, with an IC card mounted in the apparatus but not yet closed or welded.

Figure 8:
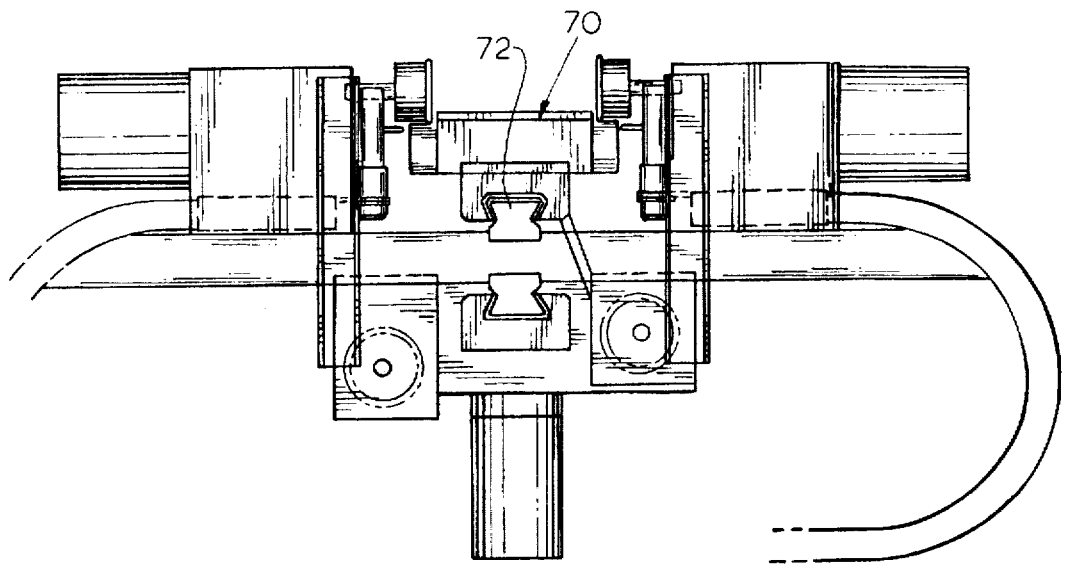

FIG. 8 is a front elevation view of the apparatus of FIG. 6.

Figure 9:
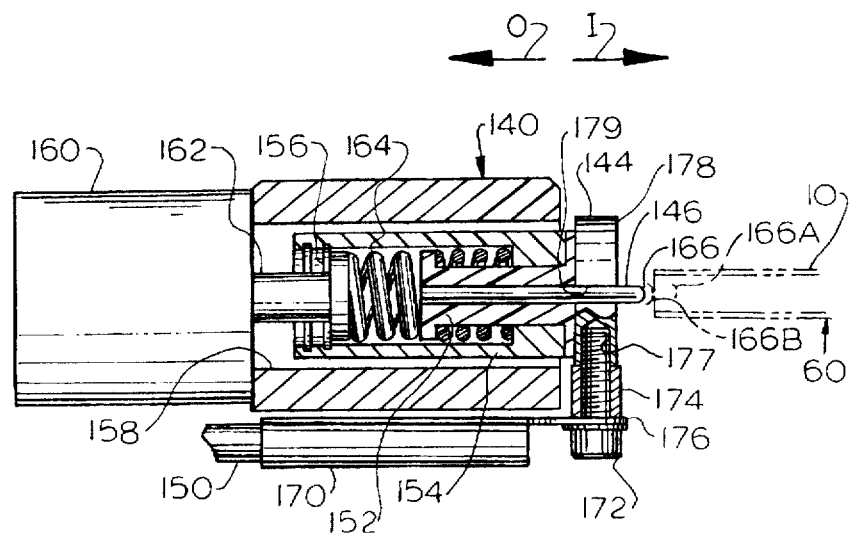

FIG. 9 is a sectional view taken on line 9—9 of FIG. 5.

DESCRIPTION OF THE PREFERRED EMBODIMENT

FIG. 2 illustrates an IC (integrated circuit) card 10 whose card components have been partially assembled. The IC card includes a circuit board 12 having opposite ends, and front and rear connectors 14, 16 attached to the circuit board ends. The board and connectors forming an inner card unit 18. A sheet metal cover 20 includes upper and lower sheet metal cover halves 22, 24. When the covers are closed on one another, upper rails 30 of the upper cover half lie closely on opposite sides of lower rails 32 of the lower cover half. The cover halves of the card of FIG. 2 may be connected together by a pair of sheet metal strips 34, 36, so the cover can be made of a single piece of stainless steel. It may be noted that when the completed IC card 10A of FIG. 1 is used, the front end 38 is first inserted into a slot of an electronic device until the front connector mates with a connector lying deep in the card-receiving slot of the electronic device.

FIG. 5 illustrates an apparatus 40 which is relatively compact and of moderate cost, which can complete the assembly of the IC card, after the unit 18 of FIG. 2 has been loaded into the lower cover half 24. The apparatus includes a frame 42 with a plate-like platform 44 at the top. The apparatus includes three weld units 50, 52, 54 lying about an imaginary weld region 60 that is of substantially parallelepiped shape and which has a vertical axis 61. That is, the region 60 is of rectangular shape as seen in a plan view as well as in side views. The weld region is to be occupied by an IC card when it is welded. The first weld unit 50 is located at the front of the weld region while the second and third units 52, 54 are respectively located at the left and right sides at the weld region. A slide assembly 70 which can hold the card, can slide along a guide rail 72. The guide rail 72 extends from below the weld region 60 in a rearward direction R therefrom, to a location rearward of the weld region. The slide assembly includes a rigid card-holding fixture 74 with a front limiter 76 and with side limiters 78 for closely positioning the bottom cover half of the card. A keeper 80 is spring biased forwardly, in the direction F, to hold the bottom cover firmly against the front limiter 76. The apparatus also includes a pair of rollers 82, 84 with roller flanges 86, 88 for pivoting the upper cover half to a closed position, prior to welding the covers together.

FIG. 7 shows the partially assembled IC card 10 mounted on the slide assembly 70 at a cover closing station 71. It is noted that the rear end 100 of the card is positioned forwardly, relative to the apparatus arrow F. To complete the card assembly, the top and bottom cover halves are joined together by moving an upper member (rollers 82, 84) with respect to a lower member (the fixture 70 of the slide assembly 70). In particular, a pneumatic roller actuator 102 is energized with compressed air to move a pair of roller holders 104 in the forward direction F. The roller flanges 86, 88 roll against opposite sides of the upper cover half 22 to progressively move down the upper cover half until it snaps against the lower cover half 24. Such progressive lowering of the upper cover half is important in assuring proper assembly of the cover halves. As shown in FIG. 4, the rails 30 of the upper cover half have inwardly-extending lower flanges 110 which lie below horizontal lower cover parts 112. As a result, when the upper cover half is moved down into place, it locks in place. The provision of welding spots as at 120, prevent the rails 30, 32 of the upper and lower cover halves from sliding on one another, which greatly increases the rigidity of the cover and therefore of the card. It may be noted that applicant may prefer to place each weld 120 so its center line 122 lies closer to the bottom of the card, where the lower flange 110 lies, then to the upper end of the card, where the upper corner 124 lies which connects a largely horizontal top main cover portion 126 to the upper rail 30. This is because the rails are closest together near where the lower flange 110 locks to the lower cover part 112, which is part of a largely planar lower main cover portion 125. Applicant prefers that the weld 120 lie at or below a horizontal center line 128 of the card, so the weld is made where the rails lie close together.

As shown in FIG. 3, the lower rails 32 each forms a lead in 128 near its card front end 38. The lead-ins help to deflect the upper rails 30 apart as the upper cover half moves down along the lower cover half. It is highly desirable to gradually spread apart the upper rails 30 by pivoting the upper cover 30 downwardly rather than moving all portions downwardly at the same time. Applicant pivots down the upper cover half by means of the roller flanges such as 86 shown in FIG. 7. When the IC card 10 is placed in the slide assembly 70, applicant first moves the rollers forwardly to the position 82F. A roller actuator 102 accomplishes this by moving a roller carriage 127 along a roller track 128. Then, a slide actuator 130 is energized, which moves the slide assembly 70 forwardly until the card 10, with its upper and lower cover halves closed, lies in the weld region 60. Another actuator 132 moves a pair of independently spring loaded grounding conductors 134 upwardly against the slide assembly 70 after the slide assembly has moved the card into the weld region.

Each of the weld units such as 54 includes two weld heads 140, 142. All three weld units are identical and each includes two such weld heads. Each weld head includes an electrode holder 144 and an electrode 146. Current is applied to the electrode holder through an electrical cable 150. As shown in FIG. 9, each weld head 140 includes an insulator 152 which is mounted within a cylinder 154 that can move within a guideway 158. A pneumatic actuator 160 has an actuator piston 162 that can move inwardly, in the direction I to move a spring 164 inwardly. The spring moves the insulator 152, cylinder 154, holder 144 and the electrode 146 inwardly. The actuator can actually move the electrode tip 166 to the position 166A, but the card 10 limits the inward movement to the position 166B. After the actuator piston has moved inwardly and compressed spring 164, a large current such as 600 amperes passes through the cable 150, through a terminal 170 at the end of the cable, and through a bolt 172 and a sleeve 174 to the electrode holder 144 and electrode 146. It is noted that the cable 150, terminal 170, and other indicated parts move with the electrode holder 144. When the actuator piston 162 moves outwardly again, a retainer ring 156 assures that the electrode holder 144 will move outwardly. The arrangement of the bolt 170 passing through a lug 176 at the end of the terminal 170 into a threaded hole 177 in the holder, provides a compact and high current-carrying capacity right-angle connection.

Each electrode holder 144 includes an aluminum disc with an inward face 178 and with a central hole 179 for receiving the electrode. As shown in FIG. 5, each holder has a slit 180, with a screw 182 that can be tightened to close the slit to grasp the electrode. The screw 182 can be loosened to remove the electrode, so it can be reversed and its opposite end can be used.

As shown in FIG. 7, the long actuators including the roller actuator 102 slide actuator 130, and the smaller ground actuator 132 are all mounted on the plate-shaped platform 44, and all lie below the platform 44, in an enclosed space enclosed by the rest of the frame 42. This leaves only the slide assembly 70 which must receive the IC card, the rollers such as 82 which must close the card cover, and the weld units such as 50, 54 which must weld the card, lying above the platform. Applicant prefers to use a control 190 which controls all of the actuators and the application of current. As a result, a worker need only place the card 10 in the position shown in FIG. 7 on the slide assembly 70 and depress a pair of safety buttons (not shown) to begin and complete the card assembly. As discussed above, the rollers such as 82 first move forward and rearward along the card to close its cover. The slide assembly 70 then moves forwardly into the weld region 60. Each of the weld heads 44 moves sequentially inwardly towards the vertical axis 192 of the weld region until the electrode is stopped by the card, and welding currents are passed through each of the six electrodes. The electrodes are then withdrawn from the card, and the rollers 82, 84 and slide assembly 70 are moved rearwardly to their initial positions. A worker can then remove the card and place a new card to be assembled on the slide assembly.

Applicant has constructed and successfully tested welding apparatus of the construction illustrated, for an IC card having a length of substantially 3.5 inches, with the other dimensions being proportional as illustrated in FIG. 7. Although the invention is shown being used for an IC card wherein the upper and lower cover halves are integral, being connected by a pair of bendable strips, the apparatus also can be used to complete the assembly of IC cards wherein the upper and lower cover halves are separate elements.

Thus, the invention provides apparatus for completing the assembly of an IC card. The apparatus includes three weld units lying at the sides of a rectangular or parallelepiped-shaped weld region. (An apparatus for another IC card uses two of the weld units, arranged at opposite sides of the weld region). A guide rail extends from below the weld region in a rearward direction and guides a slide assembly which holds an IC card to be welded, into the weld region. The apparatus also can include a pair of rollers that are mounted to roll against opposite sides of the upper cover half to progressively pivot it down against the lower cover half. A roller actuator can first move the rollers forwardly to close the card, and another actuator then moves the slide assembly forwardly into the weld region. Each of the weld units includes at least one weld head that comprises an electrode holder that is connected to a cable that has a horizontally-extending terminal with a lug, and a bolt extending vertically through a hole in the lug and into a threaded hole in the electrode holder. The weld units are preferably all mounted on top of a plate-shaped platform, with the slide actuator and roller actuator preferably lying under the platform.

Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. Apparatus for completing the assembly of an IC card that has an inner card unit comprising at least a front connector and a circuit board coupled to said front connector, by joining upper and lower sheet metal cover halves around the inner unit, comprising:

first and second weld units, arranged respectively at the right side and left side of a substantially parallelepiped-shaped weld region which has a vertical axis;

a card-holding slide assembly for holding said IC card in said weld region;

each of said weld units including a pair of weld heads each having an electrode holder with an electrode thereon, and including an electrical cable extending from said head, and actuator means for moving said weld heads inwardly to push the electrodes thereon against locations on the sheet metal cover of a card lying in said weld region to form spot welds thereon.

2. The apparatus described in claim 1 wherein said lower cover half has a largely planar cover bottom portion and a pair of primarily vertical bottom rails extending upwardly from opposite sides of said cover bottom portion, and said upper cover half has a vertical axis, a largely planar cover top portion, and a pair of top rails extending downwardly from opposite sides of said cover top portion and lying outside said bottom rails, said top rails each having a bottom flange extending inwardly from a lower end of the top rail and lying below and against said cover bottom portion;

said electrodes are positioned to weld said top and bottom rails together at each of a plurality of locations that lie closer to said bottom cover portion than to said top cover portion, to join locations on said cover halves that lie close to said flanges.

3. Apparatus for completing the assembly of an IC card that has an inner card unit comprising at least a front connector and a circuit board coupled to said front connector, by joining upper and lower sheet metal cover halves around the inner unit, comprising:

first, second, and third weld units, arranged respectively at the front, right side, and left side of a substantially parallelepiped-shaped weld region which has a vertical axis;

a guide rail extending from a location adjacent to said weld region in a rearward direction therefrom to guide a card-holding device in forward movement into said weld region and in rearward movement out therefrom;

a card-holding device that is movably mounted on said guide rail to move forwardly into said weld region and rearwardly out of said weld region;

each of said weld units including at least one weld head having an electrode holder with an electrode thereon, an electrical cable extending from said head, and an actuator which moves the weld head inwardly to push the electrode thereon against a location on the sheet metal cover to form a spot weld thereon;

a cover closing station lying outside of said weld region, and constructed to move said upper and lower cover halves together around said inner unit to produce an unwelded IC card wherein said cover halves are ready to be welded together;

a transport constructed to move said unwelded IC card at least part of the distance between said cover closing station and said weld region, including a device actuator positioned to move said card-holding device along said guide rail forwardly into said weld region and rearwardly out of said weld region.

4. The apparatus described in claim 3 wherein:

said closing station includes at least one roller mounted on a roller holder, said at least one roller having card-engaging roller portions lying at opposite sides of said card-holding device for rolling the cover halves together;

a roller actuator coupled to said roller holder, said actuator being positioned to move said roller holder forwardly to a position rearward of said weld region;

apparatus for controlling operation of said device actuator to move said card-holding device forwardly into said weld region after said roller actuator has moved said roller holder forwardly to said position.

5. The apparatus described in claim 3 wherein:

each of said electrode holders has a lower end with a vertical threaded hole therein, an inward face that faces said weld region, and a horizontally-extending hole opening to said inward face, with one of said electrodes lying in said horizontally-extending hole and projecting inwardly of said member inward face;

a cable terminal having an elongated primarily horizontally-extending outer portion for connecting to an outwardly-extending cable, said terminal having a inner end forming a lug lying under said electrode holder, and including a bolt extending upwardly through said lug and threaded into said threaded hole.

6. The apparatus described in claim 3 wherein:

said closing station includes at least one roller mounted on a roller holder, said at least one roller having card-engaging roller portions lying at opposite sides of said card-holding device for rolling the cover halves together; and including roller actuator means connected to said roller holder, for moving said roller holder forwardly and rearwardly;

control means for first operating said roller actuator means to move said at least one roller forwardly to the front of a card on said fixture, to then operate said device actuator to move a card thereon into said weld region, to operate said actuators of said weld units to move said weld heads inwardly, apply current to said weld heads, and then move said weld heads outwardly, and to then operate said device actuator to move said slide assembly rearwardly out of said weld region.

7. The apparatus described in claim 6 including a plate-like platform with upper and lower surfaces, and wherein:

said weld units are all mounted to lie on top of said platform upper surface;

said slide actuator means and roller actuator means each includes an actuator mounted to lie under said platform lower surface;

said roller actuator means includes a roller track mounted on said platform lower surface with said roller holders including a roller carriage slidably mounted on said roller track and with said roller actuator connected to said carriage.

8. Apparatus for completing the assembly of an IC card that has an inner unit comprising front and rear connectors and a circuit board extending between said connectors, by joining upper and lower sheet metal cover halves around the inner unit, comprising:

a platform having upper and lower surfaces, with a parallelepiped weld region lying above said upper surface, said weld region having front left, right, and rear sides and having a vertical axis;

first, second, and third weld units each mounted on said platform upper surface respectively slightly beyond said front, left and right sides of said weld region, with each weld unit including a pair of weld heads that each includes an electrode holder, an electrode lying in the holder and having an electrode end lying adjacent to one of said sides of said weld region, and actuator means for moving said holder in inward and outward directions respectively to and away from said weld region;

at least one weld ground device mounted on said platform, said weld ground device including at least one ground electrode lying substantially under said weld region and a ground actuator mounted on said platform and lying under said platform lower surface, and operable to move said ground electrode up and down;

a guide rail which is mounted on said platform and which extends forwardly to a position substantially at said weld region and rearwardly beyond said weld region rear side;

a card-holding slide assembly that is slidably mounted on said guide rail to move forwardly into said weld region and rearwardly out of said weld region;

an elongated slide actuator lying under said platform and coupled to said slide assembly, said slide actuator being long enough to move a card on said holding fixture forwardly completely into said weld region and rearwardly completely out of said weld region.

9. The apparatus described in claim 8 including:

a pair of roller holders;

a pair of rollers mounted on said roller holders and having flanges lying immediately above said slide assembly, to roll a card cover closed;

a roller actuator lying under said platform and coupled to said roller holders.

10. A method for completing the assembly of an IC card that has an inner unit comprising at least a front connector and a circuit board coupled to said front connector, by joining upper and lower sheet metal cover halves around the inner unit, wherein said cover halves have opposite sides with snap pads that snap together, comprising:

establishing an end of said upper cover half against an end of said lower cover half, with said upper cover half extending at an upward incline away from said end thereof;

placing said inner unit in said lower cover half and placing said lower cover half with said unit therein on a holding fixture, with said first ends of said cover halves lying rearward of the rest of said cover halves;

rolling at least one roller forwardly along opposite sides of said upper cover half to progressively lay said upper cover half against said lower cover half, until said cover snap pads snap together;

moving said holding fixture into a weld region and welding said covers together in said weld region.

11. The method described in claim 10 wherein said lower cover half has a largely planar cover bottom portion and a pair of primarily vertical bottom rails extending upwardly from opposite sides of said cover bottom portion, and said upper cover has a vertical axis, a largely planar cover top portion, a pair of top rails extending downwardly from opposite sides of said cover top portion and lying outside said bottom rails, said top rails each having a bottom flange extending inwardly from a lower end of the top rail and lying below and against said cover bottom portion, including:

welding said top and bottom rails together at each of a plurality of locations that lie closer to said bottom cover portion than to said top cover portion, to join locations on said cover halves that lie close to said flanges.

12. The method described in claim 11 wherein:

said cover halves are formed of a single sheet of steel that has a pair of bendable strips at the rear of said cover halves;

said step of rolling includes moving a pair of rollers forwardly along said opposite sides to bend said bendable strips until largely planar top and bottom cover main portions lie in spaced parallel planes, and thereafter moving said slide forwardly into said weld region, and at said weld region welding together locations at the opposite sides and at the front of said cover halves but not at the rear of said cover half.

13. Apparatus for completing the assembly of an IC card that has an inner card unit comprising a front connector and a circuit board coupled to said front connector, by joining upper and lower sheet metal cover halves around the inner unit, comprising:

first, second, and third weld units, arranged respectively at the front, right side, and left side of a substantially parallelepiped-shaped weld region which has a vertical axis and rear end;

each of said weld units including at least one weld head having an electrode holder with an electrode thereon, an electrical cable extending from said head, and an actuator which moves the weld head inwardly to push the electrode thereon against a location on the sheet metal cover to form a spot weld thereon;

a cover closing device lying outside said weld region and having upper and lower members and an actuator for moving one of said members to close said covers around said inner unit, to form a closed but unwelded card;

a transport constructed to move closed but unwelded cards produced at said cover closing device that lies outside said weld region, forwardly into said weld region through said rear end thereof and rearwardly out of said weld region.

14. The apparatus described in claim 13 wherein:

said transport includes a card-holding assembly which forms said lower member, and said transport includes a guide rail extending from a first location lying adjacent to said weld region to a location rearward thereof and constructed to guide said card-holding member in movement forwardly substantially into said weld region and rearwardly out of said weld region.

* * * * *